United States Patent [19]

Baliga

[11] 4,191,602
[45] Mar. 4, 1980

[54] LIQUID PHASE EPITAXIAL METHOD OF MAKING A HIGH POWER, VERTICAL CHANNEL FIELD EFFECT TRANSISTOR

[75] Inventor: Bantval J. Baliga, Schenectady, N.Y.

[73] Assignee: General Electric Company, Schenectady, N.Y.

[21] Appl. No.: 899,119

[22] Filed: Apr. 24, 1978

[51] Int. Cl.² .................. H01L 21/208; H01L 21/74; H01L 29/80
[52] U.S. Cl. ...................... 148/171; 29/571; 29/590; 29/578; 148/172; 148/175; 148/187; 357/20; 357/22; 357/38; 357/58
[58] Field of Search .................. 148/171–173, 148/175, 187; 357/22, 38, 58, 20; 29/571, 590, 576 E, 578

[56] References Cited

U.S. PATENT DOCUMENTS

| 3,025,438 | 3/1962 | Wegener | 357/22 |
| 3,252,003 | 5/1966 | Schmidt | 357/22 X |
| 3,274,461 | 9/1966 | Teszner | 357/22 |
| 3,381,187 | 4/1968 | Zuleeg | 357/38 X |
| 3,465,216 | 9/1969 | Teszner | 357/38 |
| 4,036,672 | 7/1977 | Kobayashi | 148/175 |
| 4,086,611 | 4/1978 | Nishizawa et al. | 357/58 X |
| 4,107,725 | 8/1978 | Yoshida et al. | 357/22 X |
| 4,128,440 | 12/1978 | Baliga | 148/171 |
| 4,132,996 | 1/1979 | Baliga | 357/22 X |

OTHER PUBLICATIONS

Farzan et al., "Depletion V-Groove MOS(VMOS) Power Transistor" Solid State Electronics, vol. 19, pp. 297–306 (1976).
Yoshida et al., "High Power MOSFET . . . Meshed Gate Structure" IEEE J. of Solid-State Circuits, vol. SC-11, 1976, pp. 472–477.

*Primary Examiner*—R. Dean
*Assistant Examiner*—W. G. Saba
*Attorney, Agent, or Firm*—Marvin Snyder; Joseph T. Cohen

[57] ABSTRACT

A high power field effect transistor having a buried grid is fabricated by epitaxially growing from the liquid phase, on a lightly doped silicon substrate, a silicon layer heavily doped with the same conductivity type determining impurities. The substrate is thinned, and a grid region heavily doped with opposite conductivity type determining impurities is diffused into the substrate. An upper layer lightly doped with the same conductivity type determining impurities as those in the substrate is then grown epitaxially from the liquid phase atop the grid region, followed by diffusion of the same conductivity type determining impurities into the upper layer. The resulting structure exhibits relatively large source-to-drain conduction area in the grid region.

13 Claims, 2 Drawing Figures

LIQUID PHASE EPITAXIAL METHOD OF MAKING A HIGH POWER, VERTICAL CHANNEL FIELD EFFECT TRANSISTOR

INTRODUCTION

This invention relates to high power field effect transistors, and more particularly to an improved vertical channel junction gate field effect transistor having a buried grid structure, and a method of fabricating such transistor.

Power field effect transistors can be fabricated in many different configurations. Among these transistors are the V-groove field effect transistor (hereinafter FET) and vertical channel FETs; however, the nonplanar geometry of these structures requires complex processing.

The FET of the present invention employs a buried grid structure. In a conventional FET employing a buried grid, the grid is typically diffused, for example, into an epitaxial layer of approximately $5 \times 10^{14}$ cm$^{-3}$ n$^-$ type doping on an n$^+$ type substrate. The designations n$^+$ and n$^-$ are used to indicate doping concentrations relatively heavier and lighter, respectively, than n type doping concentration. The grid is then covered with another n type layer of approximately $5 \times 10^{14}$ cm$^{-3}$ doping concentration, followed by an upper n$^+$ diffusion. The disadvantages of this conventional silicon FET structure, however, are first, that a low doping concentration is essential in both epitaxial layers in order to achieve the desirable high breakdown voltage and low grid pinch-off voltage. Low doping concentrations are difficult to achieve in epitaxially-grown layers in commercial, vertical channel FET manufacturing operations, and the cost of processing devices in which such low doping concentrations are employed in epitaxially-grown layers is high. Second, when silicon layers are grown epitaxially from the vapor phase, autodoping resulting in p cloud (i.e., acceptor impurities) in the epitaxial layer at the interface with the grid region may occur, severely impairing operation of the device.

The present invention concerns a new buried grid silicon field effect device suitable for high power operation, and a process for fabricating such device. The buried grid is employed in the device to accomplish control of high power. Such grids have heretofore been fabricated in a layer formed by conventional vapor phase epitaxial deposition and then covered by another layer formed in the same manner. In the present invention, however, the grid is fabricated in a substrate layer and subsequently covered by a layer formed by use of liquid phase epitaxial deposition. This permits use of a much higher resistivity substrate than was previously attainable by epitaxial growth, allowing a larger spacing between grid strips without adversely affecting gain of the device. Since the area of the grid which allows current passage therethrough is therefore relatively high, the device is capable of controlling high power loads. The high resistivity substrate is usable in the invention only because it constitutes the starting silicon wafer having a base, or first silicon layer (i.e., the drain region), grown thereon epitaxially from the liquid phase. Epitaxial growth from the liquid phase occurs faster, and at lower temperatures, than epitaxial growth from the vapor phase. Consequently, there is little, if any, diffusion of impurities from the first epitaxially-grown layer into the substrate, which would otherwise occur if the first layer were grown epitaxially from the vapor phase and would necessitate use of a more heavily-doped substrate. Use of epitaxial deposition from the liquid phase in burying a layer in a silicon electronic device is described and claimed in B. J. Baliga application Ser. No. 899,118, now U.S. Pat. No. 4,128,440, filed concurrently herewith and assigned to the instant assignee.

Accordingly, one object of the invention is to provide a high power, high gain, junction gate FET having a buried gate region in the form of a grid, and a method of fabricating such device.

Another object is to provide a silicon electronic device having a grid region buried in a lightly doped substrate, and a method of fabricating such device.

Another object is to employ epitaxial growth of silicon from the liquid phase in fabricating a silicon electronic device having a grid region buried in a lightly doped substrate region.

Briefly, in accordance with a preferred embodiment of the invention, a method of fabricating a high power field effect transistor comprises the steps of depositing silicon heavily doped to one type conductivity from a melt supersaturated with silicon heavily doped to the one type conductivity, epitaxially atop a monocrystalline silicon substrate lightly doped to the one type conductivity, and forming a grid of silicon heavily doped to the opposite type conductivity at and below the exposed major surface of the substrate. An upper layer of silicon, doped to the one type conductivity at a level between that of the substrate and that of the silicon deposited epitaxially from the melt, is epitaxially grown atop the exposed major surface of the substrate. A heavily doped region of the one type conductivity is then formed at the exposed major surface of the upper layer, extending into the upper layer a fraction of its depth.

In accordance with another preferred embodiment of the invention, a high power, vertical channel, field effect transistor comprises a silicon substrate layer doped to one type conductivity in the range of 1 to $10 \times 10^{13}$ cm$^{-3}$, and a silicon base layer heavily doped to one type conductivity in the range of $1 \times 10^{18}$ to $1 \times 10^{21}$ and formed epitaxially on one major surface of the substrate so as to provide the transistor with a drain region. A grid region, heavily doped to the opposite type conductivity, is formed at the opposite major surface of the substrate and extends from the opposite major surface into the interior of the substrate so as to provide the transistor with a gate region. A relatively thin silicon upper layer, doped to the one type conductivity at a concentration between the doping levels of the substrate and the base layer, is formed atop the gate region and the opposite major surface of the substrate, the exposed major surface of the upper layer being doped to the one type conductivity at a concentration substantially equal to the doping level of the base layer so as to provide the transistor with a source region.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

DESCRIPTION OF TYPICAL EMBODIMENTS

Figure 1:
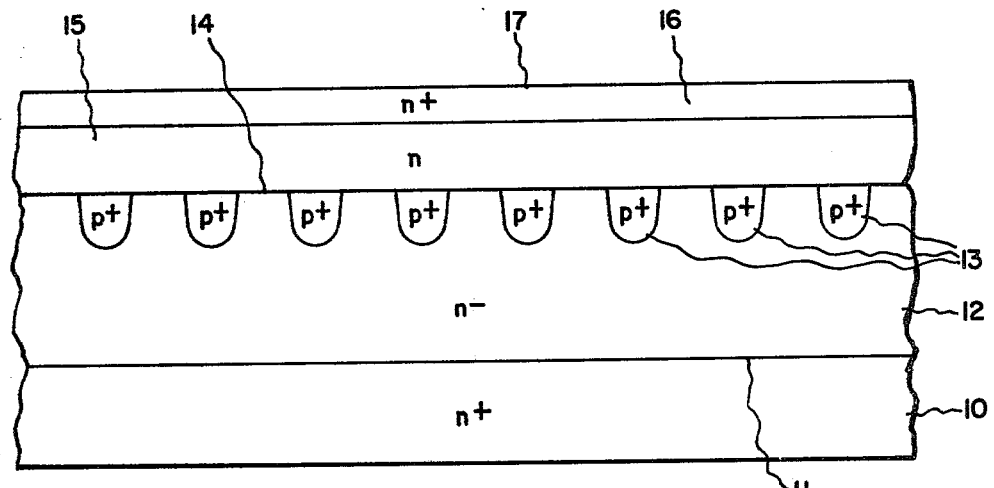
FIG. 1 is a sectional view through a portion of the silicon structure fabricated in accordance with the procedures set forth herein.

One embodiment of a device fabricated by the procedures set forth herein is illustrated in FIG. 1. A significant distinction over the previously known FET structure of FIG. 2 resides in the fact that doping levels are sufficiently different such that electronic performance of the FET shown in FIG. 1 far exceeds that of the FET shown in FIG. 2.

Specifically, the FET of FIG. 1 comprises a silicon base region 10 of one type conductivity, grown epitaxially on a major surface 11 of a monocrystalline silicon substrate 12 which is also of the one type conductivity. A grid 13 of heavily-doped opposite conductivity type silicon is formed in the opposite major surface 14 of substrate 12 and extends below surface 14 for a fraction of the depth of substrate 12. An upper silicon layer of the one type conductivity is grown epitaxially atop surface 14, with a more heavily doped region 16 of the one type conductivity extending from outer surface 17 of upper layer 15 into the upper layer for a fraction of its thickness. Relative doping levels are controlled such that substrate 12 is lightly doped, base region 10 is heavily doped, and the doping level of upper layer 15 is between that of substrate 12 and base region 10, except for region 16 which is heavily doped. Base region 10 is grown epitaxially from the liquid phase, while upper layer 15 is grown epitaxially from either the liquid or vapor phase, although the liquid phase is preferable. Thus, in fabricating an FET, base layer 10 comprises the drain region, heavily doped layer 16 comprises the source region, and grid 13 comprises the gate region. For exemplary purposes and to simplify the description of the various embodiments of the invention as well as of the prior art, the one type conductivity is herein described as n type and the opposite type conductivity is herein described as p type, although those skilled in the art will appreciate that a complementary device can be fabricated by making the one type conductivity p type and the opposite type conductivity n type.

Figure 2:
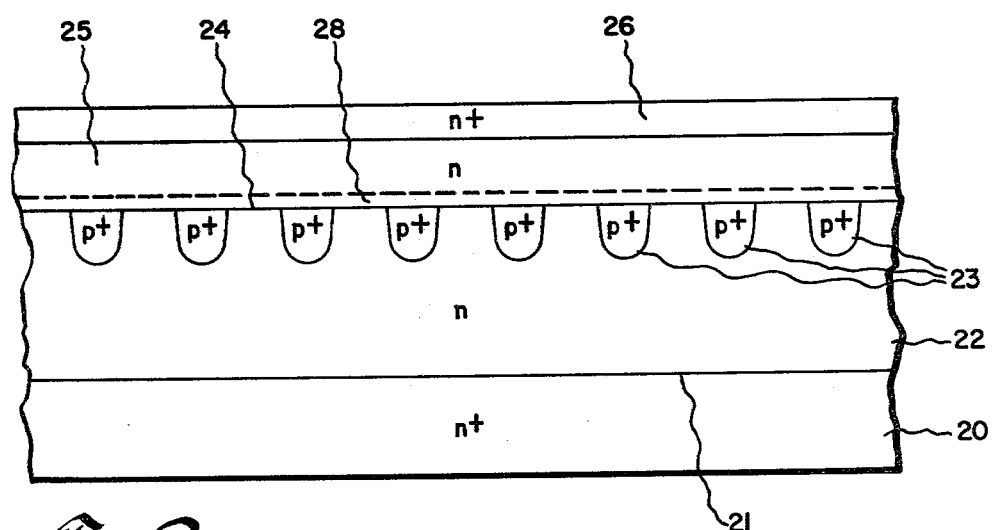
FIG. 2 is a sectional view through a portion of a silicon field effect transistor known in the prior art.

In conventional silicon FETs having buried grid structures, and constructed as shown in FIG. 2, it has been necessary to start with base layer 20, grow layer 22 epitaxially thereon, diffuse grid structure 23 into layer 22, and then grow layer 25 epitaxially atop layer 22 and grid structure 23. A thin outermost region 26 of layer 25 is then heavily diffused with the same conductivity type determining impurities employed in layer 25. Because only vapor phase epitaxial processes have heretofore been employed in performing the necessary epitaxial growth steps, n type layers 22 and 25 have each been doped to a level of approximately $5 \times 10^{14}$ cm$^{-3}$. Although lower doping levels in layer 22 would be desirable, they are difficult to achieve in silicon epitaxially grown from the vapor phase due to contamination of the gaseous source with dopants. The relatively high donor impurity concentration in epitaxial layers 22 and 25 resulted in excessively high grid pinch-off voltage, requiring relatively close spacing between adjacent strips of grid 23. The closer this spacing, the less area there is for current to pass between regions 20 and 26 by flowing in region 22 between the strips of grid 23. Consequently, such devices had limited current-carrying capacity. Moreover, epitaxial growth of layer 25 from the vapor phase often results in autodoping, causing p cloud formation in layer 25 at the interface with layer 22 as represented by layer 28. Autodoping, as described in B. J. Baliga copending application Serial No. 899,118, now U.S. Pat. No. 4,128,440, filed concurrently herewith and assigned to the instant assignee, occurs when some of the dopant in the region to be buried escapes into the vapor and redeposits in other areas of the depitaxial layer, causing unintended nonuniformity in impurity concentrations. In addition, the relatively high doping concentrations in the n type silicon between strips of grid structure 23 also serve to prevent attainment of desirably high breakdown voltage for the device, while establishing a relatively high, and therefore undesirable, grid pinch-off voltage. By employing the following procedures, however, an improved FET structure results.

In practicing the instant invention, silicon base layer 10, shown in FIG. 1, is epitaxially grown from the liquid phase onto surface 11 of lightly doped silicon substrate 12. A detailed description of epitaxial growth of silicon from the liquid phase is set forth in the aforementioned B. J. Baliga application Ser. No. 899,118, now U.S. Pat. No. 4,128,440. Substrate 12 conveniently is an n type silicon wafer, preferably of high resistivity (e.g., about 100 ohm-cm), doped in the range of about $1 \times 10^{12}$ to $10 \times 10^{13}$ cm$^{-3}$, as signified by the designation n−, and is typically about 6–8 mils in thickness. Base layer 10 is heavily doped with donor impurities to a concentration of about $1 \times 10^{18}$ to $1 \times 10^{21}$ cm$^{-3}$, as signified by the designation n+. Base layer 10 is grown to a thickness of 3–4 mils, allowing substrate 12 to be thinned down by lapping and polishing its major surface 14 to the desired thickness, typically 3–4 mils. Alternatively, substrate 12 may be thinned by chemical etching, as in an acid etch such as a mixture of nitric, acetic and hydrofluoric acids which may be in the volume ratio 3:2:1, respectively. A p type grid structure 13 is then formed on substrate layer 12 to a depth of approximately 0.2 mils below surface 14, as by planar diffusion using conventional photolithographic techniques. This grid formation procedure conventionally requires growth of silicon oxide on surface 14 of substrate 12, opening windows of appropriate size and shape by photolithographic techniques, diffusing acceptor impurities (e.g., boron) through the windows to form p type grid strips, and then removing the remaining oxide from surface 14 as by hydrofluoric etch. The dopant level for grid structure 13 is preferably about $1 \times 10^{18}$ cm$^{-3}$, as signified by the designation p+. Alternatively, grid structure 13 may be formed by conventional ion implantation of acceptor impurities into substrate 12. Following formation of grid structure 13, n type silicon layer 15 is grown epitaxially on surface 14 of substrate 12 to a thickness of about 0.5 mils and with a doping level of about $2 \times 10^{15}$ cm$^{-3}$. Epitaxial growth of layer 15 may be from either the liquid phase or vapor phase (although use of the liquid phase can essentially preclude autodoping and resultant p cloud formation). Finally, donor impurities are diffused into surface 17 of layer 15, to form heavily-doped n type region 16, as signified by the designation n+, to a depth of about 0.1 mils beneath surface 17 and at a concentration of about $1 \times 10^{20}$ cm$^{-3}$, thereby completing the silicon FET structure.

The field effect transistor shown in FIG. 1 operates in conventional fashion. Thus a conductive channel extends from source region 16 to drain region 10, through the lightly doped n− silicon regions of layer 12 between the p+ strips of grid 13 which comprise the transistor gate region. Drain region 10 is biased positive with respect to source region 16, and gate 13 is biased negative with respect to source region 16. Control of voltage amplitude on gate 13 therefore determines the amount of current flow between source 16 and drain 10.

Because grid 13 is formed in a lightly doped n− type substrate 12, pinch-off between the p+ grid strips will occur at low grid bias voltages due to large depletion layer spreading in the substrate with increasing grid bias voltage. This allows larger separation between successive grid strips, effectively providing the device with a larger conduction area through the grid region. The device is preferably designed to punch through to the heavily doped bottom or drain region 10 so as to achieve high breakdown voltage and yet maintain a short length conduction path from source region 16 to drain region 10 to provide good high frequency response and to reduce the source-drain resistance. For any given blocking capability, a higher resistance between the source and drain regions occurs with increasing resistivity of lightly doped substrate 12 impairing power-handling capability of the device; however, grid bias required to achieve pinch-off decreases with increasing resistivity of substrate 12, increasing the gain of the device. Consequently, a trade-off is essential in selecting a resistivity value for substrate 12, as it is in making a similar selection for deep groove prior art structures. Thus, the main advantages of a buried grid structure are those of simplified fabrication, due to the planar configuration of the device, and the larger source and drain areas as compared to those in a device employing a surface grid. In the event the device of FIG. 1 is fabricated with all regions being of opposite conductivity to those illustrated, those skilled in the art will appreciate that drain region 10 would then be biased negative with respect to source region 16, and gate 13 would be biased positive with respect to source region 16.

The foregoing describes a high power, high gain, junction gate FET having a buried grid structure, and a method of fabricating such structure. By employing the fabrication process of the invention, a grid region is buried in a lightly doped substrate region of a silicon electronic device. Epitaxial growth of silicon from the liquid phase is employed in fabricating this device.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

What is claimed is:

1. The method of fabricating a high power field effect transistor comprising the steps of:
   depositing silicon heavily doped to one type conductivity from a melt of silicon heavily doped to said one type conductivity, epitaxially on a major surface of a monocrystalline silicon substrate lightly doped to said one type conductivity;
   forming a grid of silicon heavily doped to the opposite type conductivity at the exposed major surface of said substrate, said grid extending beneath the exposed major surface of said surface;
   epitaxially growing an upper layer of silicon atop said exposed major surface of said substrate, said upper layer of silicon being doped to said one type conductivity at a level intermediate that of said substrate and that of said silicon deposited epitaxially from said melt; and
   forming, at the exposed major surface of said upper layer, a heavily doped region of said one type conductivity extending into said upper layer a fraction of its depth.

2. The method of claim 1 including the step of thinning said substrate to a desired thickness after depositing silicon epitaxially thereon and prior to forming said grid.

3. The method of claim 2 wherein the step of thinning said substrate comprises lapping and polishing said exposed major surface of said substrate.

4. The method of claim 2 wherein the step of thinning said substrate comprises chemical etching of said exposed major surface of said substrate.

5. The method of claim 1 wherein the step of forming a grid of silicon comprises diffusing opposite conductivity type determining impurities into said exposed major surface of said substrate in a grid pattern.

6. The method of claim 1 wherein the step of forming a grid of silicon comprises ion implanting opposite conductivity type determining impurities into said exposed major surface of said substrate in a grid pattern.

7. The method of claim 2 wherein the step of forming a grid of silicon comprises diffusing opposite conductivity type determining impurities into said exposed major surface of said substrate in a grid pattern.

8. The method of claim 2 wherein the step of forming a grid of silicon comprises ion implanting opposite conductivity type determining impurities into said exposed major surface of said substrate in a grid pattern.

9. The method of claim 1 wherein the step of forming at said exposed major surface of said upper layer a heavily doped region of said one type conductivity comprises diffusing impurities of the one conductivity determining type into said exposed major surface of said upper layer.

10. The method of claim 5 wherein the step of forming at said exposed major surface of said upper layer a heavily doped region of said one type conductivity comprises diffusing impurities of the one conductivity determining type into said exposed major surface of said upper layer.

11. The method of claim 6 wherein the step of forming at said exposed major surface of said upper layer a heavily doped region of said one type conductivity comprises diffusing impurities of the one conductivity determining type into said exposed major surface of said upper layer.

12. The method of claim 7 wherein the step of forming at said exposed major surface of said upper layer a heavily doped region of said one type conductivity comprises diffusing impurities of the one conductivity determining type into said exposed major surface of said upper layer.

13. The method of claim 8 wherein the step of forming at said exposed major surface of said upper layer a heavily doped region of said one type conductivity comprises diffusing impurities of the one conductivity determining type into said exposed major surface of said upper layer.

* * * * *